(12) United States Patent
Ratchkov et al.

(10) Patent No.: US 6,744,081 B2
(45) Date of Patent: Jun. 1, 2004

(54) INTERLEAVED TERMINATION RING

(75) Inventors: Radoslav Ratchkov, Santa Clara, CA (US); Maad Al-Dabagh, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/283,965

(22) Filed: Oct. 30, 2002

(65) Prior Publication Data

US 2004/0085099 A1 May 6, 2004

(51) Int. Cl.$^7$ .............................................. H01L 27/10
(52) U.S. Cl. ........................................ 257/207; 257/211
(58) Field of Search ................................ 257/207, 208, 257/210, 211, 691; 438/128, 129

(56) References Cited

U.S. PATENT DOCUMENTS

| | | | | |
|---|---|---|---|---|
| 4,870,300 A | * | 9/1989 | Nakaya et al. | 326/41 |
| 5,008,728 A | * | 4/1991 | Yamamura et al. | 257/207 |
| 5,723,908 A | | 3/1998 | Fuchida et al. | |
| 5,949,098 A | * | 9/1999 | Mori | 257/211 |
| 6,326,693 B1 | * | 12/2001 | Mimoto et al. | 257/773 |

* cited by examiner

*Primary Examiner*—Hung Vu
(74) *Attorney, Agent, or Firm*—Luedeka, Neely & Graham, P.C.

(57) ABSTRACT

An integrated circuit with a power and ground distribution system having a first conductive layer, a second conductive layer, and an insulating layer disposed between the first layer and the second layer. A first ring is formed in the first layer, where the first ring forms a first loop around a peripheral portion of the integrated circuit. First straps are formed in the first layer, where the first straps have connections to the first ring. First horizontal members are formed in the first layer, where the first horizontal members have connections to the first ring. Second horizontal members are formed in the first layer, where the second horizontal members do not have connections to the first ring. A second ring is formed in the second layer, where the second ring forms a second loop around the peripheral portion of the integrated circuit. The second ring is interleaved with the first ring. Second straps are formed in the second layer, where the second straps have connections to the second ring. Second vertical members are formed in the second layer, where the second vertical members have connections to the second ring. First vertical members are formed in the second layer, where the first vertical members do not have connections to the second ring. First vias form connections between the first vertical members and the first ring. Second vias form connections between the second horizontal members and the second ring. The first elements form a first subsystem such as for power, and the second elements form a second subsystem such as for ground.

20 Claims, 10 Drawing Sheets

INTERLEAVED TERMINATION RING

FIELD

This invention relates to the field of integrated circuit fabrication. More particularly, this invention relates to power and ground distribution within a monolithic integrated circuit.

BACKGROUND

Integrated circuits require both power and ground in order to operate properly. Power and ground are brought in to the integrated circuit through power and ground bonding pads, respectively, which are in turn electrically connected to separate power and ground rings, commonly called core rings. Power and ground are then distributed throughout the integrated circuit via a power mesh and a ground mesh. Individual devices, such as input output circuits, called input cells for simplicity herein, then tap into the power and ground supplies as needed by making electrical connections to the nearest mesh element.

Current core ring design schemes typically place core rings on the two layers below the top-most mesh layer, with the horizontal segments created on one layer and the vertical segments created on the other layer, where the direction of the core ring segments usually matches the preferred routing direction of the corresponding layer.

Current core ring design schemes also typically require that no devices are placed under the core ring and in the area between the core ring and the input cells. This reduces the area available for device placement and tends to increase the die size. Although rectilinear core rings could be used in some cases of different height input cells, any implementation of such core rings tends to be ineffective due to the space requirements for jogging the core ring in order to trace the input cell outline, significantly reducing the benefit of such rings.

With the introduction of multiple height input cells and rectilinear core rings, different numbers of power pads are required depending on the height of the input cells and the distance between the bonding pad and the core ring in order to meet the voltage drop requirements. Such requirements are very complicated to follow, and the required number of pads may be too high for very high inputs, resulting in an increase in the die size, which reduces the effectiveness of pad over input cell designs.

What is needed, therefore, is a power and ground distribution design that requires fewer layers and less surface area to provide power and ground from bonding pads to input cells and other devices, while keeping voltage losses at a low value.

SUMMARY

The above and other needs are met by an integrated circuit with a power and ground distribution system having a first electrically conductive layer, a second electrically conductive layer, and an electrically insulating layer disposed between the first electrically conductive layer and the second electrically conductive layer. A first termination ring is formed in the first electrically conductive layer, where the first termination ring forms a first closed loop around a peripheral portion of the integrated circuit. First pad straps are also formed in the first electrically conductive layer, where the first pad straps have electrical connections to the first termination ring. First horizontal mesh members are additionally formed in the first electrically conductive layer, where the first horizontal mesh members have electrical connections to the first termination ring. Second horizontal mesh members are further formed in the first electrically conductive layer, where the second horizontal mesh members do not have electrical connections to the first termination ring.

A second termination ring is formed in the second electrically conductive layer, where the second termination ring forms a second closed loop around the peripheral portion of the integrated circuit. The second termination ring is interleaved with the first termination ring. Second pad straps are also formed in the second electrically conductive layer, where the second pad straps have electrical connections to the second termination ring. Second vertical mesh members are additionally formed in the second electrically conductive layer, where the second vertical mesh members have electrical connections to the second termination ring. First vertical mesh members are further formed in the second electrically conductive layer, where the first vertical mesh members do not have electrical connections to the second termination ring.

First electrically conductive vias in the electrically insulating layer form electrical connections between the first vertical mesh members formed in the second electrically conductive layer and the first termination ring formed in the first electrically conductive layer. Similarly, second electrically conductive vias in the electrically insulating layer form electrical connections between the second horizontal mesh members formed in the first electrically conductive layer and the second termination ring formed in the second electrically conductive layer.

The first termination ring, first pad straps, first horizontal mesh members, first vertical mesh members, and first electrically conductive vias form a first distribution subsystem, and the second termination ring, second pad straps, second horizontal mesh members, second vertical mesh members, and second electrically conductive vias form a second distribution subsystem.

In this manner, the power and ground distribution systems are formed using only two electrically conductive layers, with an intervening electrically insulating layer. With this design, either of the first distribution subsystem or the second distribution subsystem may be assigned as the power or ground distribution subsystem. Further, the vias which interconnect the elements of each subsystem need only pass through one intermediate layer, and thus do not interfere with routing layers. In addition, input cells can be placed directly below the termination rings, thus enabling greater freedom in input cell placement and input cell configuration.

In various preferred embodiments of the invention, the first distribution subsystem is a power distribution subsystem and the second distribution subsystem is a ground distribution subsystem. Alternately, the first distribution subsystem is a ground distribution subsystem and the second distribution subsystem is a power distribution subsystem. Preferably, both the first distribution subsystem and the second distribution subsystem are formed substantially of copper. The first distribution subsystem and the second distribution subsystem preferably overlie the input cells of the integrated circuit.

The first pad straps preferably make electrical connections to first bonding pads, and the second pad straps preferably make electrical connections to second bonding pads. Preferably, portions of the first pad straps are additionally formed in the second electrically conductive layer and make electrical connections to the first pad straps in the first electrically conductive layer through a first series of electrically conductive vias. Similarly, portions of the second pad straps are preferably additionally formed in the first electrically conductive layer and make electrical connections to the second pad straps in the second electrically conductive layer through a second series of electrically conductive vias. In one embodiment the first electrically conductive layer overlies the second electrically conductive layer, and in an alternate embodiment the second electrically conductive layer overlies the first electrically conductive layer.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
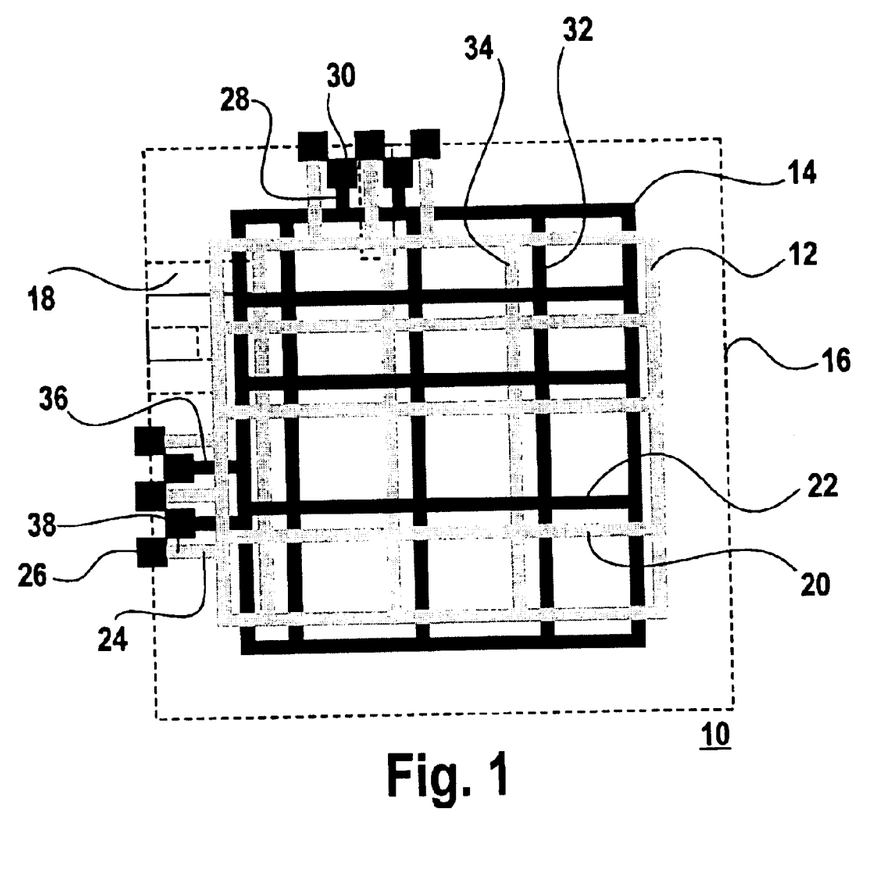
FIG. 1 is a top plan view of an integrated circuit, showing power and ground termination rings, power and ground mesh, and power and ground bonding pad straps on two layers of the integrated circuit.

With reference now to FIG. 1, there is depicted a top plan view of an integrated circuit 10, showing a power termination ring 12, a ground termination ring 14, power mesh 20 and 34, ground mesh 22 and 32, power bonding pad straps 24 and 38, and ground bonding pad straps 28 and 36 on two layers of the integrated circuit 10. Thus, FIG. 1 provides an overview of the system that is described with more particularity below. The designations of "power" and "ground" are used in reference to the various elements of the electrical distribution system described herein, as such designations make the embodiments of the invention easier to understand. However, it is appreciated that other more generic designations could be used, such as "first" and "second." Thus, the subsystems described herein could be connected as either power or ground, and do not necessarily need to be configured as one or the other in the specific manner as described herein, which is by way of example only and not limitation. Further, issues such as which layer overlies the other, which layer includes the horizontal mesh members and which layer includes the vertical mesh members are also by way of example and not limitation.

Figure 2:
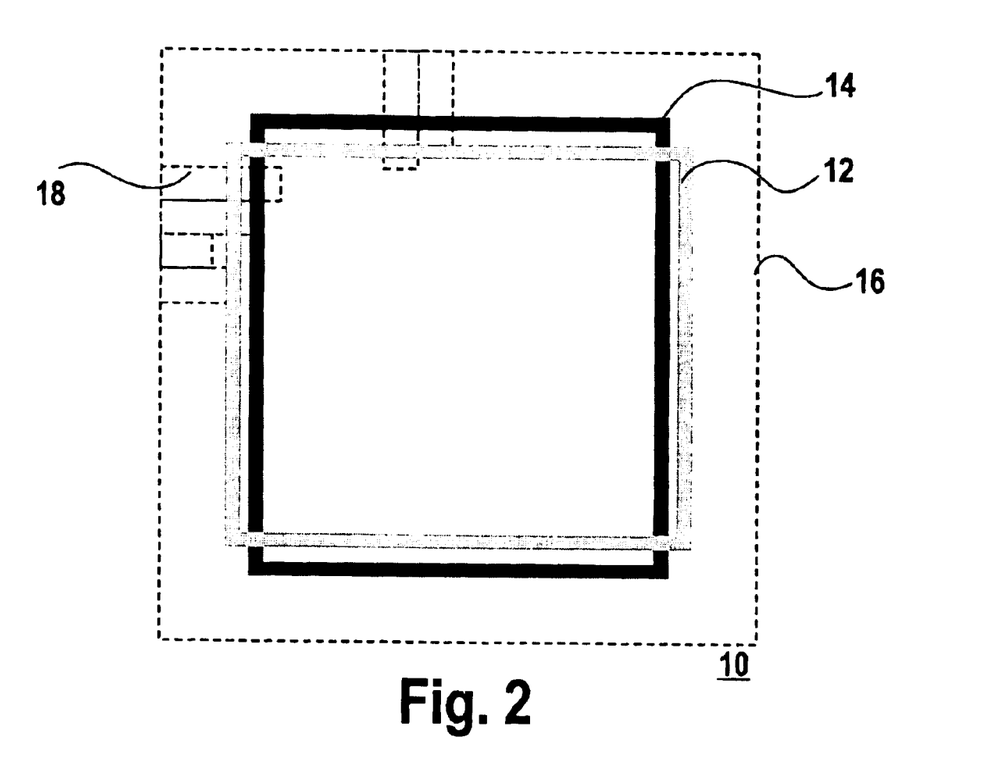
FIG. 2 is a top plan view of an integrated circuit, showing power and ground termination rings on two layers of the integrated circuit.

With reference now to FIG. 2, there is depicted a top plan view of a power termination ring 12 formed in an upper electrically conductive layer and a ground termination ring 14 formed in a lower electrically conductive layer. The two termination rings 12 and 14 are preferably interleaved, in that they cross one another when viewed from above, such as in the specific manner depicted in FIG. 2. The termination rings 12 and 14 are separated vertically by an electrically insulating layer, and are disposed near the periphery 16 of the integrated circuit 10. The periphery 16 is preferably near the outer edge of the integrated circuit 10, but is preferably not the outer edge itself. The termination rings 12 and 14 also preferably overlie input cells 18, which may be formed in a variety of sizes and configurations.

As introduced above, the invention is not limited to specific configurations of the power and ground terminations rings 12 and 14 as depicted, in that they may be interleaved in a different manner, and either may overlie the other. Further, while there is at least one electrically insulating layer separating the two termination rings 12 and 14, there may be additional layers between them, which layers may have a variety of functions. However, in the preferred embodiment, only a single insulating layer is disposed between the termination rings 12 and 14.

Figure 3:
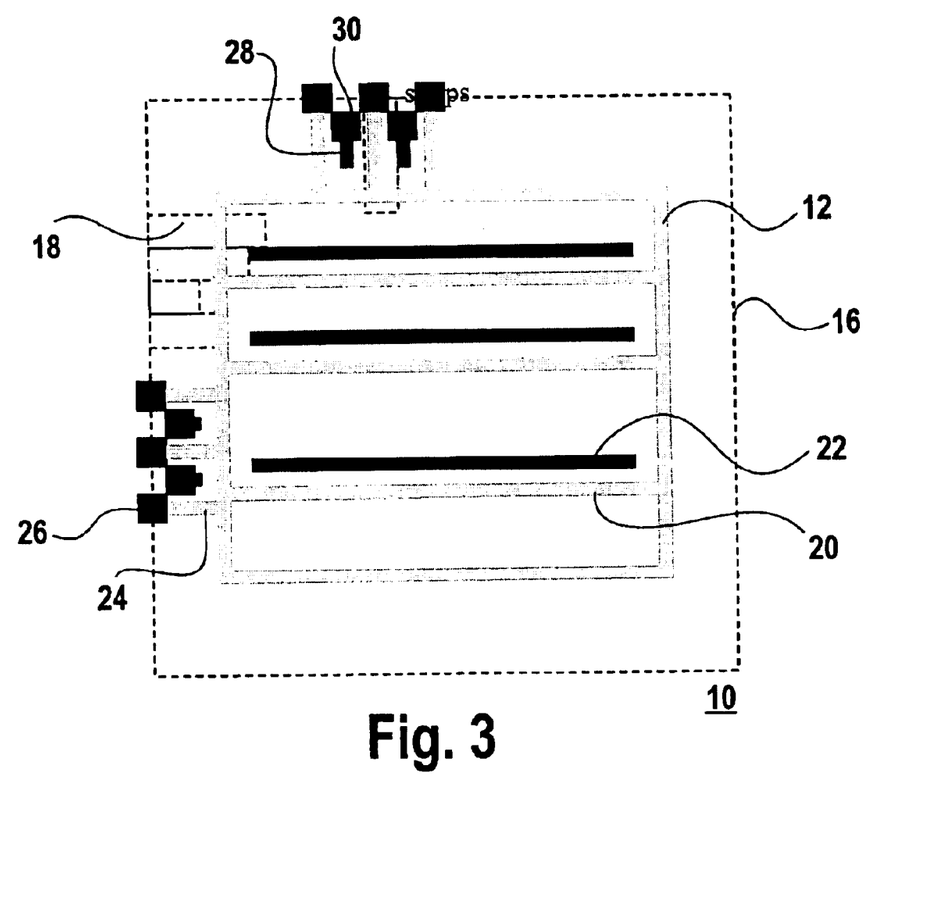
FIG. 3 is a top plan view of an integrated circuit, showing the power termination ring, horizontal portions of the power and ground mesh, and portions of the power and ground bonding pad straps on the top layer of the integrated circuit.

Referring now to FIG. 3, there is depicted a top plan view of additional elements on the upper layer, including horizontal power mesh members 20 and horizontal ground mesh members 22. The horizontal power mesh members 20 are electrically connected to the power termination ring 12 formed on the same level, while the horizontal ground mesh members 22 are not electrically connected to the power termination ring 12, even though they are formed on the same level. Also formed on the upper layer are power pad straps 24, which are electrically connected to the power termination ring 12, and are intended to be connected to power bonding pads 26. In addition, partial ground pad straps 28 are also formed, but not electrically connected to the power termination ring 12. The partial ground pad straps 28 are intended to be connected to ground bonding pads 30.

Figure 4:
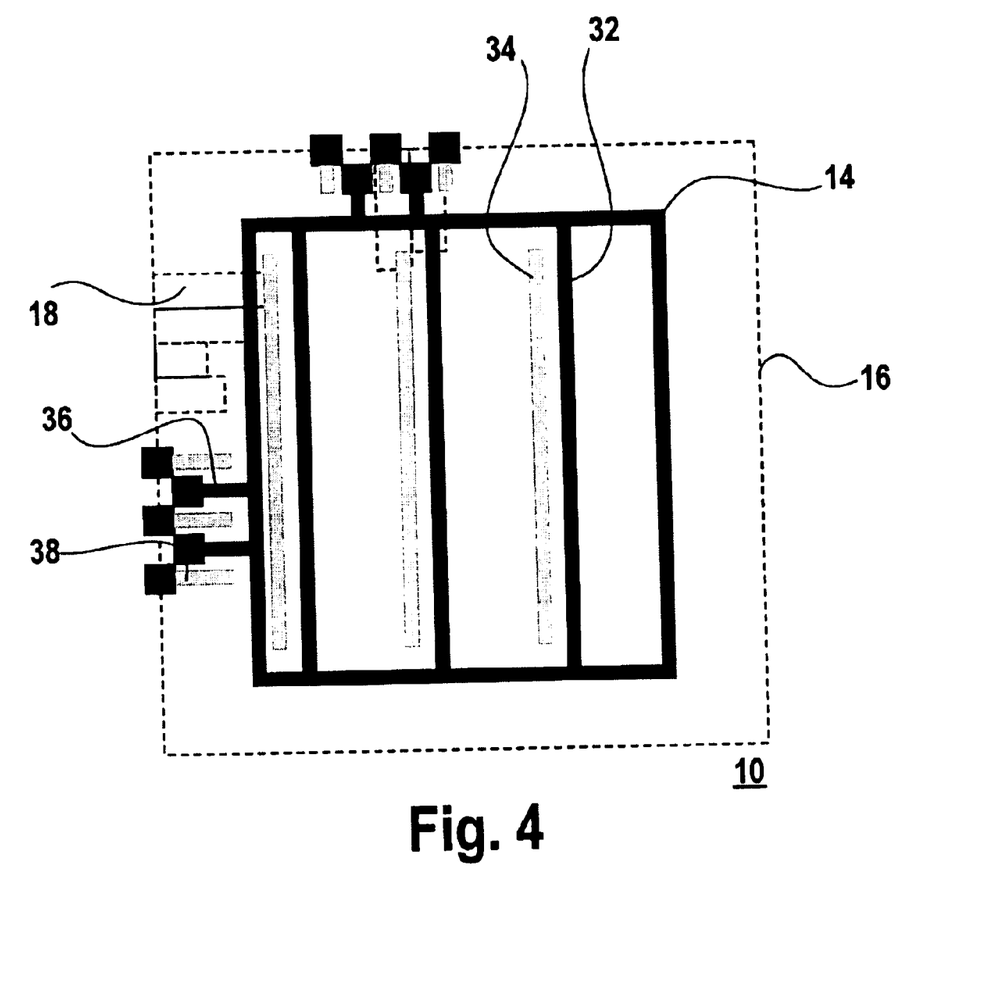
FIG. 4 is a top plan view of an integrated circuit, showing the ground termination ring, vertical portions of the power and ground mesh, and portions of the power and ground bonding pad straps on the bottom layer of the integrated circuit.

FIG. 4 similarly depicts a top plan view of additional elements on the lower layer, including vertical ground mesh members 32 and vertical power mesh members 34. The vertical ground mesh members 32 are electrically connected to the ground termination ring 14 formed on the same level, while the vertical power mesh members 34 are not electrically connected to the ground termination ring 14, even though they are formed on the same level. Also formed on the lower layer are ground pad straps 36, which are electrically connected to the ground termination ring 14, and are intended to be connected to ground bonding pads 30. In addition, partial power pad straps 38 are also formed, but not electrically connected to the ground termination ring 14. The partial power pad straps 38 are intended to be connected to power bonding pads 26.

Figure 5:
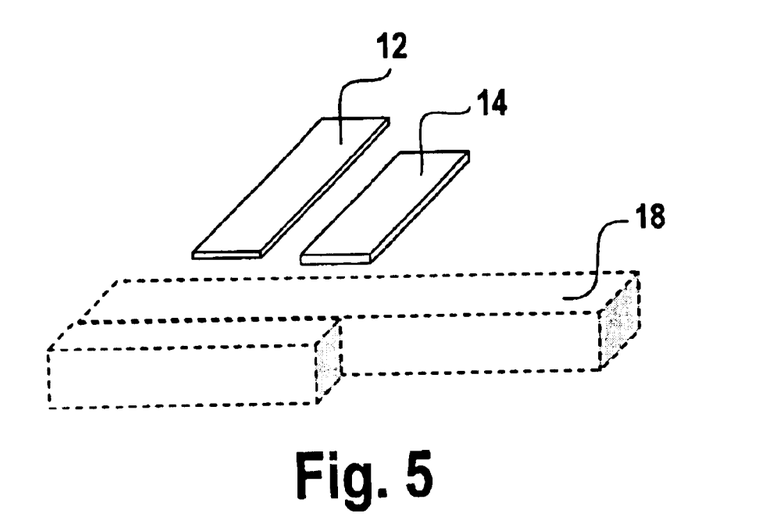
FIG. 5 is a perspective view of an integrated circuit, showing power and ground termination rings as they appear on the right and left of the integrated circuit, over the input cells.
Figure 6:
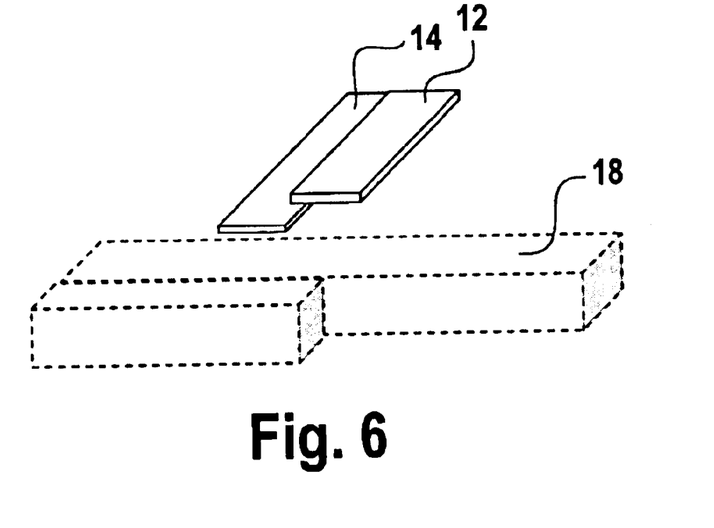
FIG. 6 is a perspective view of an integrated circuit, showing power and ground termination rings as they appear on the top and bottom of the integrated circuit, over the input cells.

FIG. 5 depicts a perspective view of how the power 12 and ground 14 termination rings appear over the input cells 18 on the left and right of the integrated circuit 10. The intervening electrically insulating layer is not depicted. Similarly, FIG. 6 depicts a perspective view of how the power 12 and ground 14 termination rings appear over the input cells 18 on the top and bottom of the integrated circuit 10. The intervening electrically insulating layer is again not depicted. It is appreciated that FIGS. 5 and 6 depict a specific example only, and not a limitation. As mentioned above, either the power or the ground may be disposed on either the upper or the lower layer, and either the power or the ground may be either the inner or the outer of the two interleaved rings at either the right and left or the top and bottom of the integrated circuit.

Figure 7:
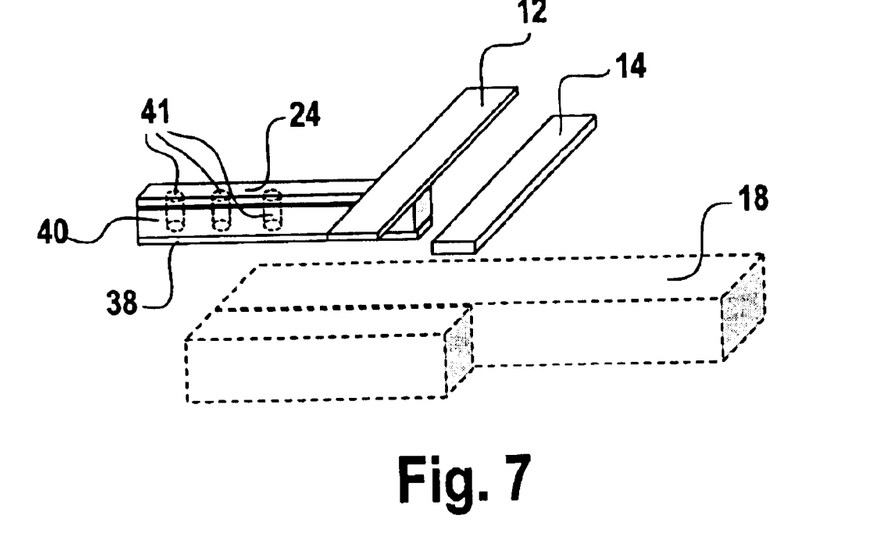
FIG. 7 is a perspective view of an integrated circuit, showing power and ground termination rings and a power strap as they appear on the right and left of the integrated circuit, over the input cells.

FIG. 7 depicts the power pad strap 24 connected to the power termination ring 12, and the partial power pad strap 38 disposed on the same level as, but not making connection with the ground termination ring 14. FIG. 7 depicts how this connection would appear on the left and right of the integrated circuit 10. Disposed between the power pad strap 24 and the partial power pad strap 38 is the insulating layer 40. The power pad strap 24 and the partial power pad strap 38 are electrically connected one to the other by a series of electrically conductive vias 41 that extend through the electrically insulating layer 40.

Figure 8:
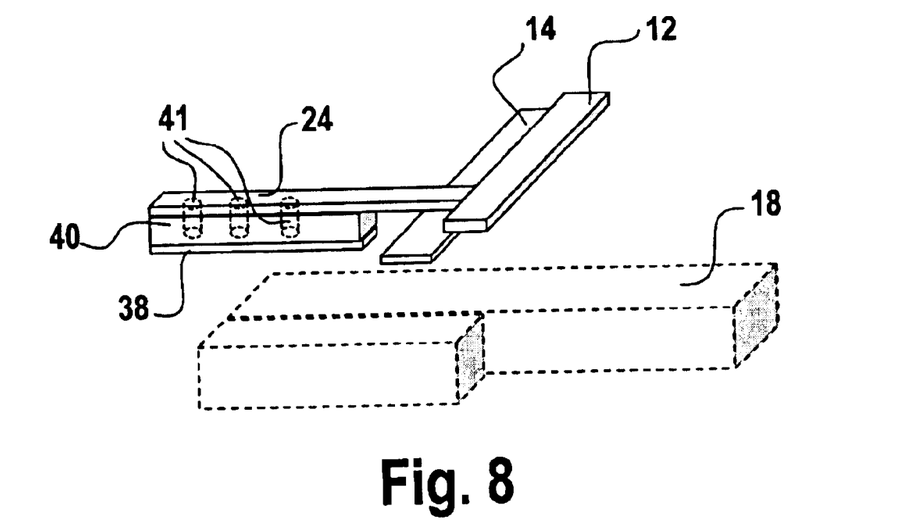
FIG. 8 is a perspective view of an integrated circuit, showing power and ground termination rings and a power strap as they appear on the top and bottom of the integrated circuit, over the input cells.

FIG. 8 depicts the power pad strap 24 connected to the power termination ring 12, and the partial power pad strap 38 disposed on the same level as, but not making connection with the ground termination ring 14. FIG. 8 depicts how this connection would appear on the top and bottom of the integrated circuit 10. Disposed between the power pad strap 24 and the partial power pad strap 38 is the insulating layer 40. The power pad strap, 24 and the partial power pad strap 38 are electrically connected one to the other by a series of electrically conductive vias 41 that extend through the electrically insulating layer 40.

Figure 9:
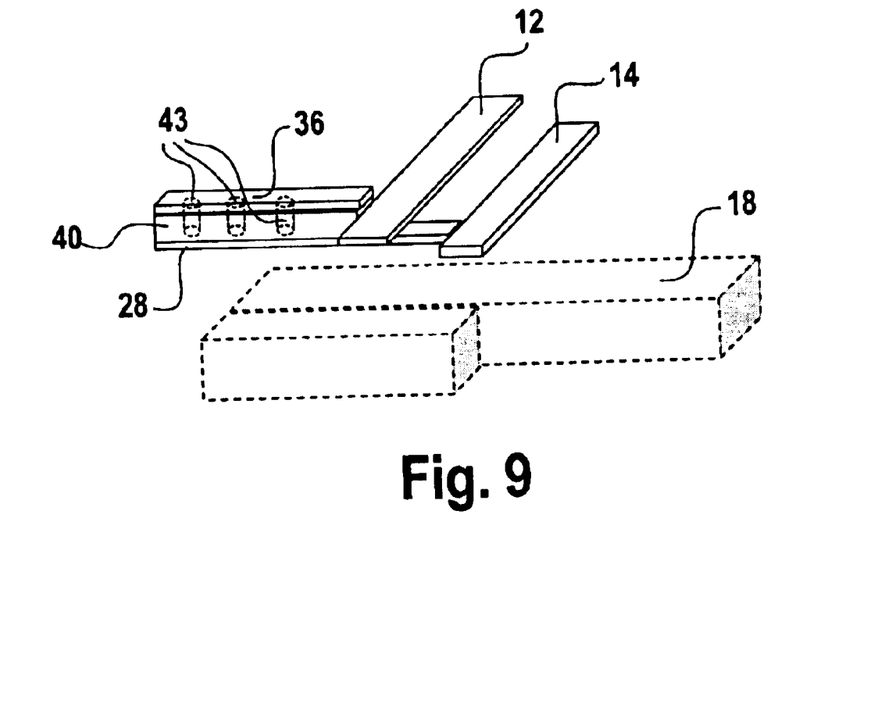
FIG. 9 is a perspective view of an integrated circuit, showing power and ground termination rings and a ground strap as they appear on the right and left of the integrated circuit, over the input cells.

FIG. 9 depicts the ground pad strap 28 connected to the ground termination ring 14, and the partial ground pad strap 36 disposed on the same level as, but not making connection with the power termination ring 12. FIG. 9 depicts how this connection would appear on the left and right of the integrated circuit 10. Disposed between the ground pad strap 28 and the partial ground pad strap 36 is the insulating layer 40. The ground pad strap 28 and the partial ground pad strap 36 are electrically connected one to the other by a series of electrically conductive vias 43 that extend through the electrically insulating layer 40.

Figure 10:
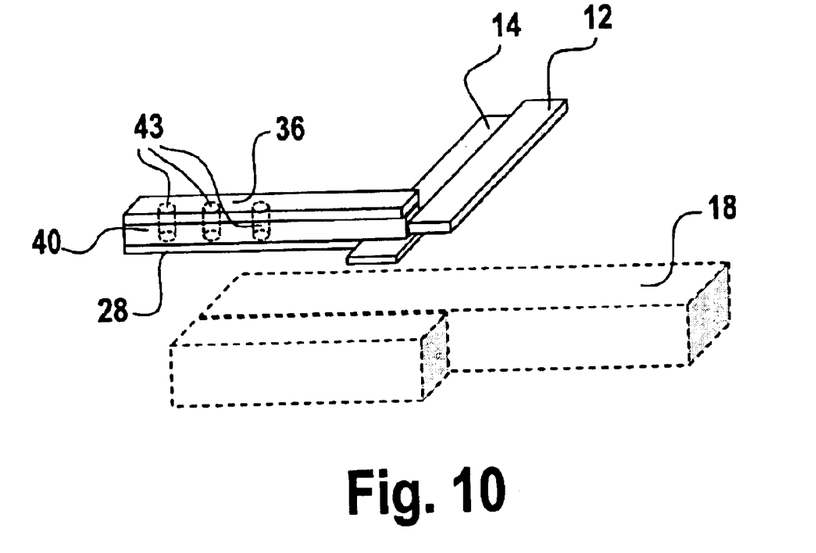
FIG. 10 is a perspective view of an integrated circuit, showing power and ground termination rings and a ground strap as they appear on the top and bottom of the integrated circuit, over the input cells.

FIG. 10 depicts the ground pad strap 28 connected to the ground termination ring 14, and the partial ground pad strap 36 disposed on the same level as, but not making connection with the power termination ring 12. FIG. 10 depicts how this connection would appear on the top and bottom of the integrated circuit 10. Disposed between the ground pad strap 28 and the partial ground pad strap 36 is the insulating layer 40. The ground pad strap 28 and the partial ground pad strap 36 are electrically connected one to the other by a series of electrically conductive vias 43 that extend through the electrically insulating layer 40.

Figure 11:
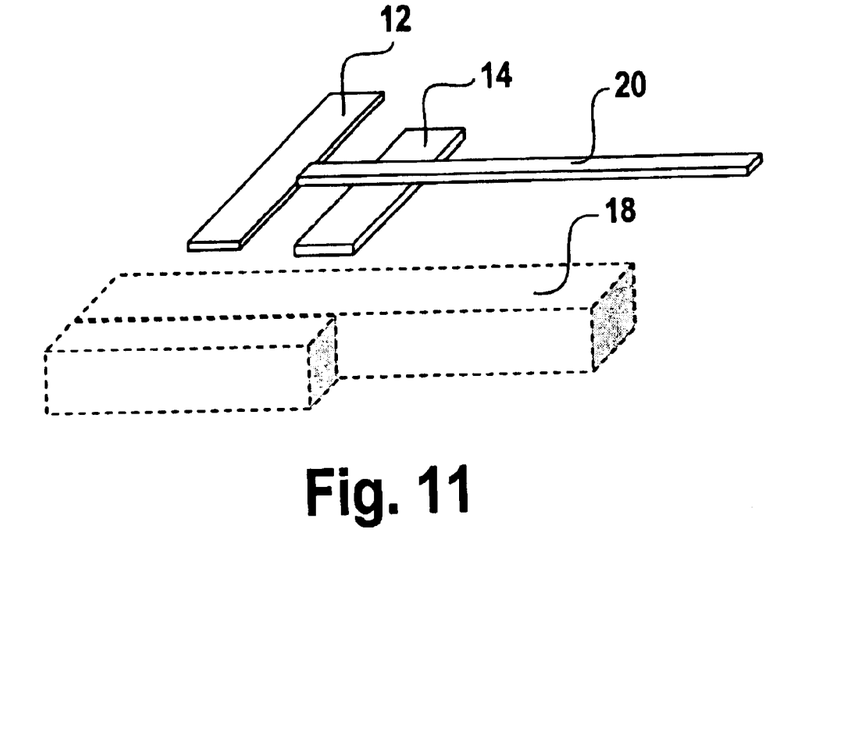
FIG. 11 is a perspective view of an integrated circuit, showing power and ground termination rings and a power mesh element as they appear on the right and left of the integrated circuit, over the input cells.
Figure 12:
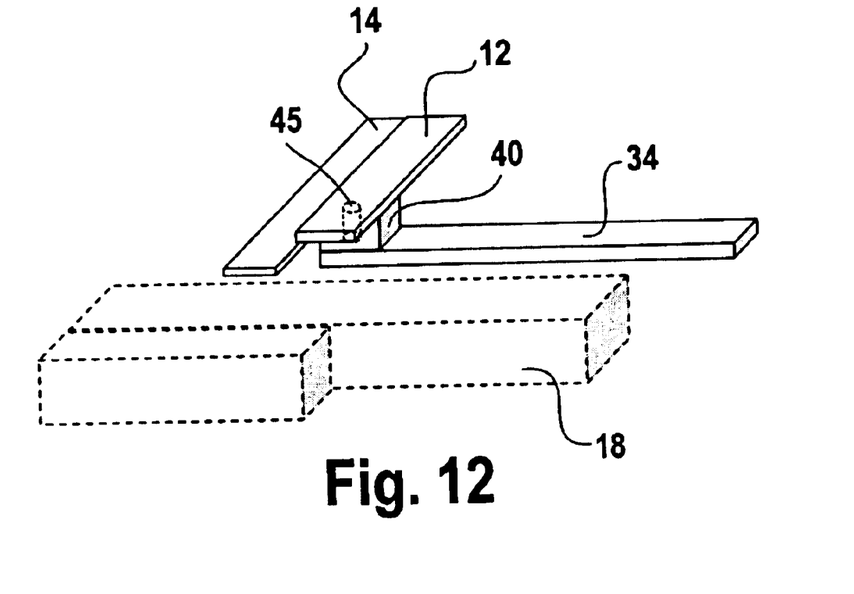
FIG. 12 is a perspective view of an integrated circuit, showing power and ground termination rings and a power mesh element as they appear on the top and bottom of the integrated circuit, over the input cells.

FIG. 11 depicts a horizontal power mesh element 20 electrically connected to the power termination ring 12, as it would appear on the left and right of the integrated circuit 10. FIG. 12 depicts a vertical power mesh element 34 electrically connected through a via 45 in the electrically insulating layer 40 to the power termination ring 12, as it would appear on the top and bottom of the integrated circuit 10. As can be seen in FIG. 12, the vertical power mesh element 34 is formed on the same layer as the ground termination ring 14.

Figure 13:
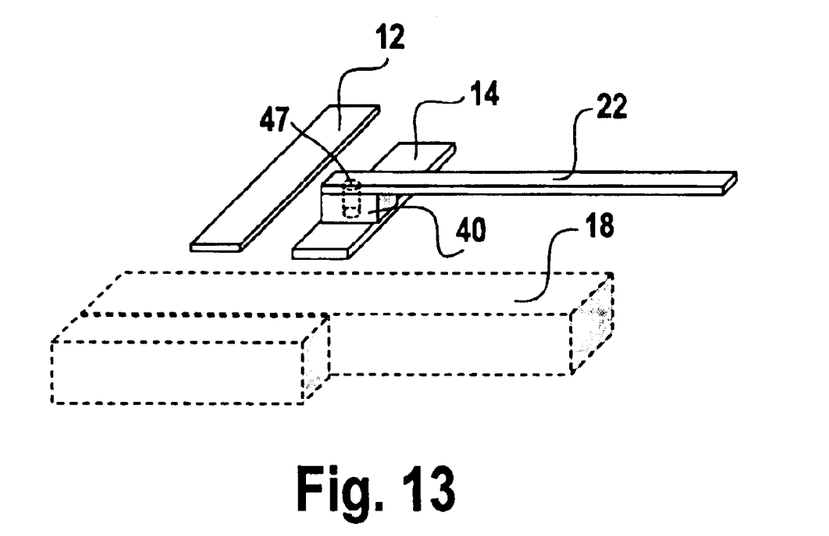
FIG. 13 is a perspective view of an integrated circuit, showing power and ground termination rings and a ground mesh element as they appear on the right and left of the integrated circuit, over the input cells.
Figure 14:
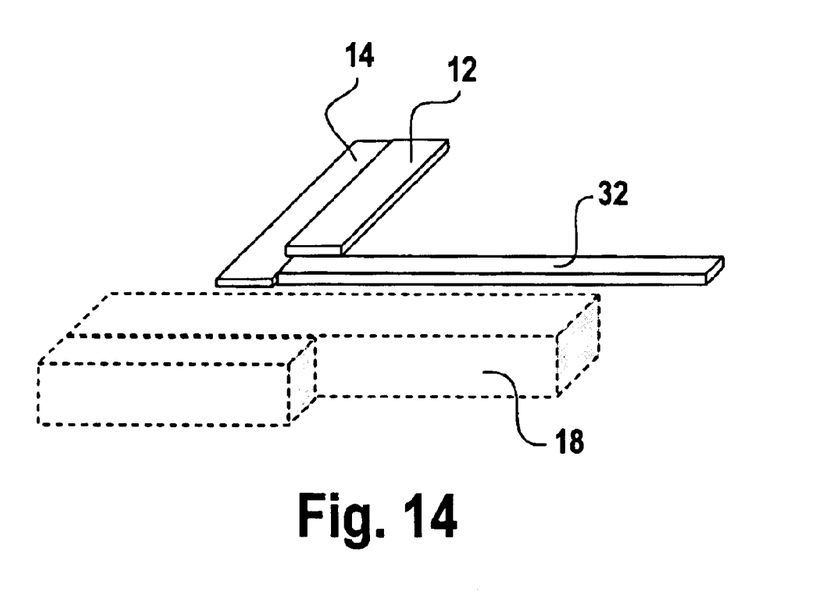
FIG. 14 is a perspective view of an integrated circuit, showing power and ground termination rings and a ground mesh element as they appear on the top and bottom of the integrated circuit, over the input cells.

FIG. 13 depicts a horizontal ground mesh element 22 electrically connected through a via 47 in the electrically insulating layer 40 to the ground termination ring 14, as it would appear on the left and right of the integrated circuit 10. As can be seen in FIG. 13, the horizontal ground mesh element 22 is formed on the same layer as the power termination ring 12. FIG. 14 depicts a vertical ground mesh element 32 electrically connected to the ground termination ring 14 as it would appear on the top and bottom of the integrated circuit 10.

Figure 15:
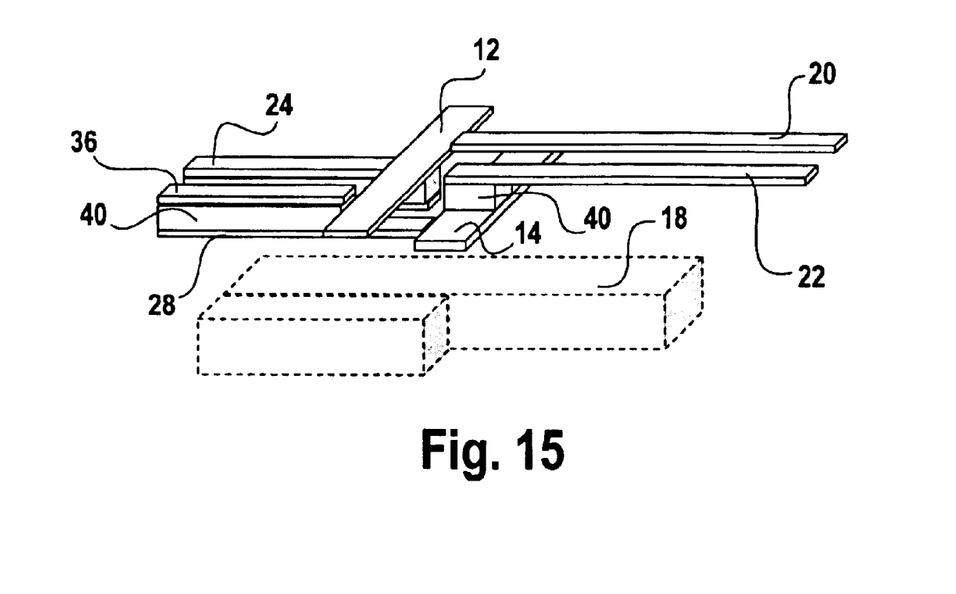
FIG. 15 is a perspective view of an integrated circuit, showing power and ground termination rings, power and ground straps, and power and ground mesh elements as they appear on the right and left of the integrated circuit, over the input cells.
Figure 16:
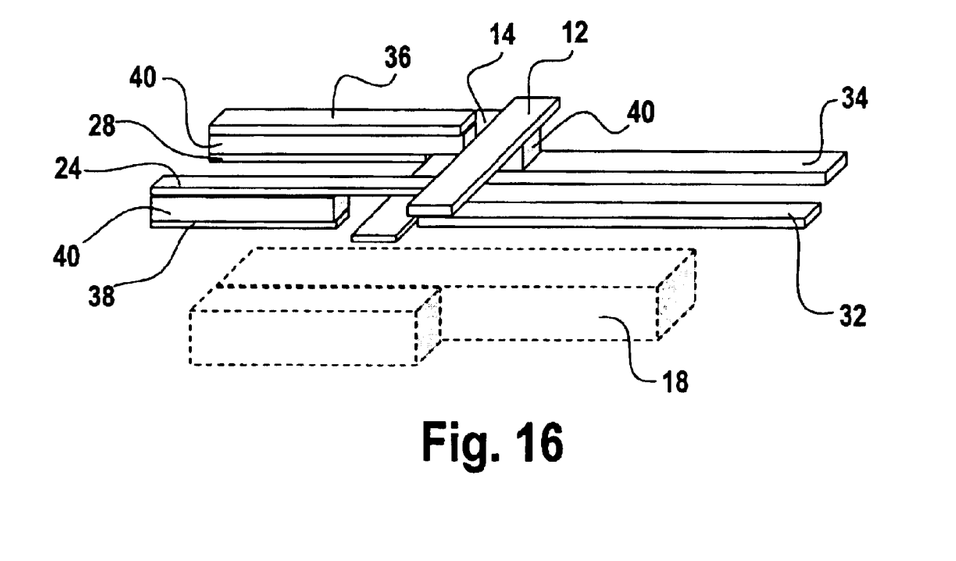
FIG. 16 is a perspective view of an integrated circuit, showing power and ground termination rings, power and ground straps, and power and ground mesh elements as they appear on the top and bottom of the integrated circuit, over the input cells

FIG. 15 depicts several of the connections described above, as they would appear at the right and left of the integrated circuit 10, and FIG. 16 depicts several of the connections described above, as they would appear at the top and bottom of the integrated circuit 10.

The power termination ring 12, power pad straps, partial power pad straps, power horizontal mesh members, power vertical mesh members, and power electrically conductive vias form a power distribution subsystem, and the ground termination ring, ground pad straps, ground partial pad straps, ground horizontal mesh members, ground vertical mesh members, and ground electrically conductive vias form a ground distribution subsystem. Again it is mentioned that either the top or the bottom termination ring may be the power distribution subsystem, and either the top or the bottom termination ring may be the ground distribution subsystem. Further, the selection of the specific layer on which the horizontal mesh members are connected to the termination ring is by way of example, and may be either layer, and the selection of the specific layer on which the vertical mesh members are connected to the termination ring is also by way of example, and may be either layer.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. An integrated circuit, the improvement comprising a power and ground distribution system having:
    a first electrically conductive layer,
    a second electrically conductive layer,
    an electrically insulating layer disposed between the first electrically conductive layer and the second electrically conductive layer,
    a first termination ring formed in the first electrically conductive layer, the first termination ring forming a first closed loop around a peripheral portion of the integrated circuit,
    first pad straps formed in the first electrically conductive layer, the first pad straps having electrical connections to the first termination ring,
    first horizontal mesh members formed in the first electrically conductive layer, the first horizontal mesh members having electrical connections to the first termination ring,
    second horizontal mesh members formed in the first electrically conductive layer, the second horizontal mesh members not having electrical connections to the first termination ring,
    a second termination ring formed in the second electrically conductive layer, the second termination ring forming a second closed loop around the peripheral portion of the integrated circuit, the second termination ring interleaved with the first termination ring,
    second pad straps formed in the second electrically conductive layer, the second pad straps having electrical connections to the second termination ring,
    second vertical mesh members formed in the second electrically conductive layer, the second vertical mesh members having electrical connections to the second termination ring,
    first vertical mesh members formed in the second electrically conductive layer, the first vertical mesh members not having electrical connections to the second termination ring,
    first electrically conductive vias in the electrically insulating layer forming electrical connections between the first vertical mesh members formed in the second electrically conductive layer and the first termination ring formed in the first electrically conductive layer,
    second electrically conductive vias in the electrically insulating layer forming electrical connections between the second horizontal mesh members formed in the first electrically conductive layer and the second termination ring formed in the second electrically conductive layer,
    the first termination ring, first pad straps, first horizontal mesh members, first vertical mesh members, and first electrically conductive vias forming a first distribution subsystem, and
    the second termination ring, second pad straps, second horizontal mesh members, second vertical mesh members, and second electrically conductive vias forming a second distribution subsystem.

2. The integrated circuit of claim 1, wherein the first distribution subsystem is a power distribution subsystem.

3. The integrated circuit of claim 1, wherein the first distribution subsystem is a ground distribution subsystem.

4. The integrated circuit of claim 1, wherein the second distribution subsystem is a power distribution subsystem.

5. The integrated circuit of claim 1, wherein the second distribution subsystem is a ground distribution subsystem.

6. The integrated circuit of claim 1, wherein the first distribution subsystem is formed substantially of copper.

7. The integrated circuit of claim 1, wherein the second distribution subsystem is formed substantially of copper.

8. The integrated circuit of claim 1, wherein the first distribution subsystem overlies input cells of the integrated circuit.

9. The integrated circuit of claim 1, wherein the second distribution subsystem overlies input cells of the integrated circuit.

10. The integrated circuit of claim 1, wherein the first pad straps make electrical connections to first bonding pads.

11. The integrated circuit of claim 1, wherein the second pad straps make electrical connections to second bonding pads.

12. The integrated circuit of claim 1, wherein portions of the first pad straps are additionally formed in the second electrically conductive layer and make electrical connections to the first pad straps in the first electrically conductive layer through a first series of electrically conductive vias.

13. The integrated circuit of claim 1, wherein portions of the second pad straps are additionally formed in the first electrically conductive layer and make electrical connections to the second pad straps in the second electrically conductive layer through a second series of electrically conductive vias.

14. The integrated circuit of claim 1, wherein the first electrically conductive layer overlies the second electrically conductive layer.

15. The integrated circuit of claim 1, wherein the second electrically conductive layer overlies the first electrically conductive layer.

16. The integrated circuit of claim 1, wherein additional layers are disposed between the first electrically conductive layer and the second electrically conductive layer.

17. An integrated circuit, the improvement comprising a power and ground distribution system having:
    a first electrically conductive layer,
    a second electrically conductive layer overlying the first electrically conductive layer,
    an electrically insulating layer disposed between the first electrically conductive layer and the second electrically conductive layer,
    a power termination ring formed in the first electrically conductive layer, the power termination ring forming a power closed loop around a peripheral portion of the integrated circuit,
    power pad straps formed in the first electrically conductive layer, the power pad straps having electrical connections to the power termination ring,
    power horizontal mesh members formed in the first electrically conductive layer, the power horizontal mesh members having electrical connections to the power termination ring, ground horizontal mesh members formed in the first electrically conductive layer, the ground horizontal mesh members not having electrical connections to the power termination ring, a ground termination ring formed in the second electrically conductive layer, the ground termination ring forming a ground closed loop around the peripheral portion of the integrated circuit, the ground termination ring interleaved with the power termination ring, ground pad straps formed in the second electrically conductive layer, the ground pad straps having electrical connections to the ground termination ring, ground vertical mesh members formed in the second electrically conductive layer, the ground second vertical mesh members having electrical connections to the ground termination ring, power vertical mesh members formed in the second electrically conductive layer, the power vertical mesh members not having electrical connections to the ground termination ring, power electrically conductive vias in the electrically insulating layer forming electrical connections between the power vertical mesh members formed in the second electrically conductive layer and the power termination ring formed in the first electrically conductive layer, ground electrically conductive vias in the electrically insulating layer forming electrical connections between the ground horizontal mesh members formed in the first electrically conductive layer and the ground termination ring formed in the second electrically conductive layer, the power termination ring, power pad straps, power horizontal mesh members, power vertical mesh members, and power electrically conductive vias forming a power distribution subsystem, and the ground termination ring, ground pad straps, ground horizontal mesh members, ground vertical mesh members, and ground electrically conductive vias forming a ground distribution subsystem.

18. The integrated circuit of claim 17, wherein additional layers are disposed between the first electrically conductive layer and the second electrically conductive layer.

19. An integrated circuit, the improvement comprising a power and ground distribution system having:

a first electrically conductive layer, a second electrically conductive layer, an electrically insulating layer disposed between the first electrically conductive layer and the second electrically conductive layer, a first termination ring formed in the first electrically conductive layer, the first termination ring forming a first closed loop around a peripheral portion of the integrated circuit, first pad straps formed in the first electrically conductive layer, the first pad straps having electrical connections to the first termination ring, wherein portions of the first pad straps are additionally formed in the second electrically conductive layer and make electrical connections to the first pad straps in the first electrically conductive layer with a first series of electrically conductive vias, and the first pad straps make electrical connections to first bonding pads, first horizontal mesh members formed in the first electrically conductive layer, the first horizontal mesh members having electrical connections to the first termination ring, second horizontal mesh members formed in the first electrically conductive layer, the second horizontal mesh members not having electrical connections to the first termination ring, a second termination ring formed in the second electrically conductive layer, the second termination ring forming a second closed loop around the peripheral portion of the integrated circuit, the second termination ring interleaved with the first termination ring, second pad straps formed in the second electrically conductive layer, the second pad straps having electrical connections to the second termination ring, wherein portions of the second pad straps are additionally formed in the first electrically conductive layer and make electrical connections to the second pad straps in the second electrically conductive layer with a second series of electrically conductive vias, and the second pad straps make electrical connections to second bonding pads, second vertical mesh members formed in the second electrically conductive layer, the second vertical mesh members having electrical connections to the second termination ring, first vertical mesh members formed in the second electrically conductive layer, the first vertical mesh members not having electrical connections to the second termination ring, first electrically conductive vias in the electrically insulating layer forming electrical connections between the first vertical mesh members formed in the second electrically conductive layer and the first termination ring formed in the first electrically conductive layer, second electrically conductive vias in the electrically insulating layer forming electrical connections between the second horizontal mesh members formed in the first electrically conductive layer and the second termination ring formed in the second electrically conductive layer, the first termination ring, first pad straps, first horizontal mesh members, first vertical mesh members, and first electrically conductive vias forming a first distribution subsystem, and the second termination ring, second pad straps, second horizontal mesh members, second vertical mesh members, and second electrically conductive vias forming a second distribution subsystem.

20. The integrated circuit of claim 19, wherein the first distribution subsystem and the second distribution subsystem overlie input cells of the integrated circuit.

* * * * *